US011226559B2

(12) United States Patent
Chen et al.

(10) Patent No.: US 11,226,559 B2
(45) Date of Patent: Jan. 18, 2022

(54) BLOCKING GROUPS FOR LIGHT POLYMERIZABLE RESINS USEFUL IN ADDITIVE MANUFACTURING

(71) Applicant: Carbon, Inc., Redwood City, CA (US)

(72) Inventors: Kai Chen, Sunnyvale, CA (US);
Andrew Gordon Wright, Mountain View, CA (US); Mu San Zhang, San Francisco, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

(21) Appl. No.: 16/615,446

(22) PCT Filed: Jun. 7, 2018

(86) PCT No.: PCT/US2018/036441
§ 371 (c)(1),
(2) Date: Nov. 21, 2019

(87) PCT Pub. No.: WO2018/226943
PCT Pub. Date: Dec. 13, 2018

(65) Prior Publication Data

US 2020/0174367 A1   Jun. 4, 2020

Related U.S. Application Data

(60) Provisional application No. 62/516,893, filed on Jun. 8, 2017.

(51) Int. Cl.
*G03F 7/029* (2006.01)
*B33Y 10/00* (2015.01)
(Continued)

(52) U.S. Cl.
CPC ............ *G03F 7/029* (2013.01); *B29C 64/124* (2017.08); *B29C 64/129* (2017.08);
(Continued)

(58) Field of Classification Search
CPC ....... B29C 71/02; B29C 64/30; B29C 64/124; B33Y 10/00; B33Y 70/00
See application file for complete search history.

(56) References Cited

U.S. PATENT DOCUMENTS

| 3,694,389 A | 9/1972 | Levy |
| 5,236,637 A | 8/1993 | Hull |

(Continued)

FOREIGN PATENT DOCUMENTS

| EP | 0860742 | 8/1998 |
| EP | 1529793 | 5/2005 |

(Continued)

OTHER PUBLICATIONS

Wicks, Douglas A., and Zeno W. Wicks Jr. "Blocked isocyanates III: Part A. Mechanisms and chemistry." Progress in Organic Coatings 36.3 (1999): 148-172. (Year: 1999).*

(Continued)

*Primary Examiner* — Galen H Hauth
(74) *Attorney, Agent, or Firm* — Myers Bigel, P.A.

(57) ABSTRACT

Provided herein is a method of forming a three-dimensional object in which the polymerizable liquid includes a mixture of (i) a light polymerizable first component, and (ii) a heat polymerizable second component; the heat polymerizable second component comprising (i) a first blocked reactive constituent that is blocked with a volatile blocking group, and optionally (ii) a curative. Upon heating a formed three-dimensional intermediate sufficiently, the volatile blocking group is cleaved and vaporizes out of the three-dimensional intermediate, to form the three-dimensional object. Also provided is a three-dimensional object produced by the method. Further provided is a polymerizable liquid compo- (Continued)

sition useful for carrying out the method, and prepolymers and monomers useful for the polymerizable liquid composition.

36 Claims, 3 Drawing Sheets

(51) Int. Cl.
| | |
|---|---|
| *B33Y 70/00* | (2020.01) |
| *B29C 64/129* | (2017.01) |
| *C08G 18/12* | (2006.01) |
| *C09D 11/101* | (2014.01) |
| *C09D 11/102* | (2014.01) |
| *B29C 64/188* | (2017.01) |
| *B29C 64/124* | (2017.01) |
| *B29C 64/30* | (2017.01) |
| *B29C 71/02* | (2006.01) |
| *B29K 105/00* | (2006.01) |

(52) U.S. Cl.
CPC ............ *B29C 64/188* (2017.08); *B29C 64/30* (2017.08); *B29C 71/02* (2013.01); *B33Y 10/00* (2014.12); *B33Y 70/00* (2014.12); *C08G 18/12* (2013.01); *C09D 11/101* (2013.01); *C09D 11/102* (2013.01); *B29K 2105/0002* (2013.01)

(56) References Cited

U.S. PATENT DOCUMENTS

| | | | |
|---|---|---|---|
| 5,391,072 A | 2/1995 | Lawton et al. | |
| 5,529,473 A | 6/1996 | Lawton et al. | |
| 6,747,088 B1 * | 6/2004 | Schwalm ........... C08G 18/0819 |
| | | | 427/372.2 |
| 7,438,846 B2 | 10/2008 | John | |
| 7,892,474 B2 | 2/2011 | Shkolnik et al. | |
| 8,110,135 B2 | 2/2012 | El-Siblani | |
| 9,205,601 B2 | 12/2015 | DeSimone et al. | |
| 9,211,678 B2 | 12/2015 | DeSimone et al. | |
| 9,216,546 B2 | 12/2015 | DeSimone et al. | |
| 9,453,142 B2 | 9/2016 | Rolland et al. | |
| 9,598,606 B2 | 3/2017 | Rolland et al. | |
| 2004/0052966 A1 | 3/2004 | Wilke et al. | |
| 2013/0102943 A1 | 4/2013 | Holzdoerfer et al. | |
| 2013/0292862 A1 | 11/2013 | Joyce | |
| 2013/0295212 A1 | 11/2013 | Chen et al. | |
| 2016/0136889 A1 | 5/2016 | Rolland et al. | |
| 2016/0160077 A1 | 6/2016 | Rolland et al. | |
| 2017/0113416 A1 | 4/2017 | DeSimone et al. | |

FOREIGN PATENT DOCUMENTS

| | | | |
|---|---|---|---|
| JP | 2004341278 | 12/2004 | |
| WO | WO-2015200173 A1 * | 12/2015 | ............ C08F 220/34 |

OTHER PUBLICATIONS

Janusziewcz et al. "Layerless fabrication with continuous liquid interface production" Proceedings of the National Academy of Sciences USA, 113(42):11703-11708 (2016).

Tubleston et al. "Continuous liquid interface production of 3D objects" Science, 347(6228):1349-1352 (2015).

International Search Report and Written Opinion corresponding to PCT/US2018/036441, dated Sep. 3, 2018 (10 pp).

\* cited by examiner

BLOCKING GROUPS FOR LIGHT POLYMERIZABLE RESINS USEFUL IN ADDITIVE MANUFACTURING

CROSS REFERENCE TO RELATED APPLICATIONS

This application is a 35 U.S.C. § 371 national phase application of International Application Serial No. PCT/US2018/036441, filed Jun. 7, 2018, which claims the benefit of U.S. provisional patent application Ser. No. 62/516,893, filed on Jun. 8, 2017, the disclosure of which is incorporated by reference herein in its entirety.

FIELD OF THE INVENTION

The present invention concerns additive manufacturing in general, and particularly concerns dual cure resins useful in methods such as stereolithography and continuous liquid interface production (CLIP).

BACKGROUND OF THE INVENTION

In conventional additive manufacturing techniques (often referred to as "3D printing"), construction of a three-dimensional object is performed in a step-wise or layer-by-layer manner by sequentially exposing a light-polymerizable resin to patterned light. Generally referred to as "stereolithography," numerous examples are known, including those described in U.S. Pat. No. 5,236,637 to Hull (see, e.g., FIGS. 3-4) and U.S. Pat. No. 7,892,474 to Shkolnik. Additional examples are given in U.S. Pat. Nos. 5,391,072 and 5,529,473 to Lawton, U.S. Pat. No. 7,438,846 to John, U.S. Pat. No. 8,110,135 to El-Siblani, and US Patent Application Publication Nos. 2013/0292862 to Joyce and 2013/0295212 to Chen et al.

Unfortunately, additive manufacturing techniques have generally been slow, and have long been known to produce parts with a limited range of mechanical properties, frequently rendering such products unsuitable for real world use beyond simple prototyping.

More recently, techniques referred to as "continuous liquid interface production" (or "CLIP") have been developed. These techniques enable the rapid production of three-dimensional objects, preferably in a layerless manner, by which the parts may have desirable structural and mechanical properties. See, e.g., J. DeSimone et al., U.S. Pat. Nos. 9,211,678; 9,205,601; and 9,216,546; J. Tumbleston, et al., *Continuous liquid interface production of 3D Objects*, Science 347, 1349-1352 (published online Mar. 16, 2015), and R. Janusziewcz et al., *Layerless fabrication with continuous liquid interface production*, Proc. Natl. Acad. Sci. USA 113, 11703-11708 (Oct. 18, 2016).

The speed, and other attributes, of CLIP opened the door to the development of "dual cure" stereolithography resins, in which the shape of an article is created by light polymerization in the additive manufacturing process, and the mechanical properties of the article are created in a second cure that typically follows (for example, by baking). Dual cure resins that provide for a range of mechanical properties in the final product are described in, for example, J. Rolland et al., U.S. Pat. Nos. 9,453,142 and 9,598,606, and US Patent Application Publication Nos. 2016/0136889 and 2016/0160077.

The requirements imposed on a light polymerizable resin during the different steps of a dual cure additive manufacturing process can, however, compete with one another. For example, ingredients that provide for a liquid resin that is readily processed by additive manufacturing to produce an intermediate "green" part (e.g., low viscosity) may be detrimental to producing a reasonably strong "green" part. And ingredients that might provide for a strong green part may be detrimental to the mechanical properties of the finished part after a second cure such as a baking step.

J. Rolland et al. (cited above) solve this problem by employing, in a dual cure resin, light polymerizable ingredients that help form the green object, but then degrade during the second (typically heat) cure to form a constituent that participates in the second cure (and hence contribute to the mechanical properties of the finished part). Specifically, light polymerizable ("reactive") blocking groups were used to block the otherwise reactive isocyanate ("NCO") groups of a monomer or prepolymer to create a light polymerizable constituent (Scheme 1), which blocking groups subsequently degrade on heating to unmask the NCO group so that it can participate in a subsequent cure (e.g., upon baking) to produce a polyurethane or polyurea polymer in the finished object.

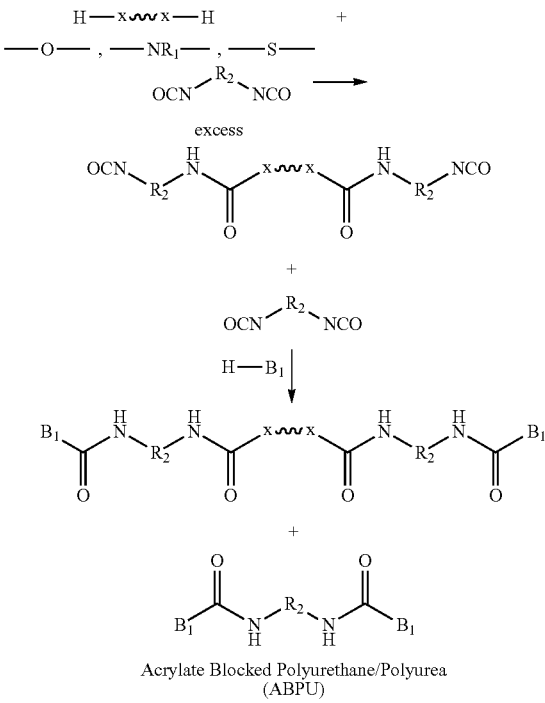

Scheme 1. Synthesis of an acrylate blocked polyurethane/polyurea prepolymer (ABPU) as disclosed in J. Rolland et al., supra.

Acrylate Blocked Polyurethane/Polyurea (ABPU)

In Scheme 1 above, H-$B_1$ represents a UV-reactive blocking agent, $B_1$ represents a UV-reactive blocking group (such as an acrylate); $R_2$ represents an organic group, the wavy line represents a polymeric organic group (as found in a prepolymer); and x is as given therein.

While satisfactory for many uses, the foregoing approach is in some cases limited to chemical systems which produce finished objects having a glass transition temperature ($T_g$) close to room temperature. Yet, for finished objects that are to be elastomeric, glass transition temperatures substantially less than room temperature are preferred. On the other hand, for finished objects that are to be more rigid, glass transition temperatures substantially above room temperature are preferred. In addition, the more UV-reactive blocking agent used can make it difficult to maximize the polyurethane/polyurea weight fraction in the final material. From the perspective of formulation, it is often desirable to have more polyurethane/polyurea fraction in the final material as the UV fraction may either be too brittle or too fragile depending on the $T_g$. Therefore, there is a need for additional approaches in dual cure resins for additive manufacturing that complement those previously developed.

SUMMARY OF THE INVENTION

A method of forming a three-dimensional object can be carried out by:

(a) providing a carrier and an optically transparent member having a build surface, the carrier and the build surface defining a build region therebetween;

(b) filling the build region with an (optionally but preferably non-aqueous) polymerizable liquid, the polymerizable liquid comprising a mixture of (i) a light polymerizable first component, and (ii) a heat polymerizable second component;

the heat polymerizable second component comprising (i) a first blocked reactive constituent that is blocked with a volatile blocking group, and optionally but preferably (ii) a curative;

(c) irradiating the build region with light through the optically transparent member to form a solid polymer scaffold from the first component and also advancing the carrier and the build surface away from one another to form a three-dimensional intermediate having the same shape as, or a shape to be imparted to, the three-dimensional object, with the three-dimensional intermediate containing the first blocked reactive constituent in unpolymerized form; and then (d) heating the three-dimensional intermediate sufficiently to (i) cleave the volatile blocking group from the reactive constituent and (ii) polymerize the blocked reactive constituent with itself, and/or the curative, and with (iii) the volatile blocking group vaporizing out of the three-dimensional intermediate, to form the three-dimensional object. (note that (i) and (ii) may occur in any order, or concurrently).

In some embodiments, the volatile blocking group comprises a ketoxime, amide, imide, imidazole, pyrazole, alcohol, or sterically-hindered amine blocking group.

In some embodiments, the first blocked reactive constituent comprises a blocked polyisocyanate.

In some embodiments, the first blocked reactive constituent comprises a ketoxime-blocked polyisocyanate.

In some embodiments, the curative comprises a polyol, a polyamine, a polyetheramine, or a combination thereof.

In some embodiments, the three-dimensional object comprises a polymer blend, interpenetrating polymer network, semi-interpenetrating polymer network, or sequential interpenetrating polymer network formed from the first component and the second component.

In some embodiments, the second component comprises precursors to a polyurethane, polyurea, or copolymer thereof; a silicone resin, an epoxy resin, a cyanate ester resin, or a natural rubber.

In some embodiments, the first blocked reactive constituent is included in the polymerizable liquid in an amount of from 1, 2, 5 or 10 percent by weight, to 30, 40, or 50 percent by weight, or more.

In some embodiments, the polymerizable liquid further comprises at least one photoinitiator (e.g., in an amount of from 0.1 to 1 or 5 percent by weight), optionally at least one dye (e.g., in an amount of 0.001 or 0.01 to 1 or 5 percent by weight), and optionally at least one filler (e.g., in an amount of 0.01 or 0.1 to 20 or 50 percent by weight).

In some embodiments: the light polymerizable first component comprises a second blocked reactive constituent that is blocked with a light reactive blocking group; and the curing step (d) is carried out under conditions in which at least a portion of the solid polymer scaffold produced by light polymerization of the second reactive constituent degrades and forms a constituent that participates in the heat polymerizing.

In some embodiments, the second blocked reactive constituent comprises a blocked polyisocyanate having two or more ethylenically unsaturated end groups.

In some embodiments, the second blocked reactive constituent is included in the polymerizable liquid in an amount of from 1, 2, 5 or 10 percent by weight, to 30, 40, or 50 percent by weight, or more.

In some embodiments, the first blocked reactive constituent (e.g., VBPU) and the second blocked reactive constituent (e.g., ABPU), are included together in the polymerizable liquid in a weight ratio of from 1:5, 1:10 or 1:20, to 5:1, 10:1 or 20:1.

In some embodiments: (i) the object is elastomeric and is comprised of a polymer having a glass transition temperature of no more than −20 or 0° C.; or (ii) the object is rigid and is comprised of a polymer having a glass transition temperature of at least 50 or 70° C.

A further aspect of the invention is a three-dimensional object produced by the method of any preceding claim (e.g., wherein the object includes a three-dimensional lattice).

A further aspect of the invention is a polymerizable liquid composition as described above, and described further below.

A further aspect is a prepolymer compound of formula I:

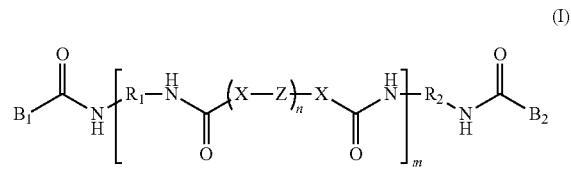

wherein:

$B_1$ is a reactive blocking group;

$B_2$ is a volatile blocking group;

$R_1$ and $R_2$ are independently selected from the group comprising an aliphatic, aromatic or mixed aliphatic and aromatic group;

X is O, S, or $NR_3$, wherein $R_3$ is H or a straight chain or branched $C_1$-$C_{10}$ alkyl group;

Z is a polymeric organic group;

n is an integer in the range of from 1, 5, 10, 20 or 30 to 80, 100, or 150; and m is an integer in the range of from 1, 5, 10 or 20 to 50, 70 or 100.

A further aspect is a monomer compound of formula II:

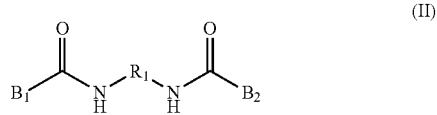

wherein:
B₁ is a reactive blocking group;
B₂ is a volatile blocking group; and
R₁ is an aliphatic, aromatic or mixed aliphatic and aromatic group.

A further aspect of the invention is a polymerizable liquid composition containing a prepolymer and/or monomer compound as described above.

U.S. Pat. No. 3,694,389 to Levy describes thermosetting compositions containing ketoxime-blocked isocyanates, but suggest their use only as coatings.

The foregoing and other objects and aspects of the present invention are explained in greater detail in the drawings herein and the specification set forth below. The disclosures of all United States patent references cited herein are to be incorporated herein by reference.

DETAILED DESCRIPTION OF ILLUSTRATIVE EMBODIMENTS

Figure 1:
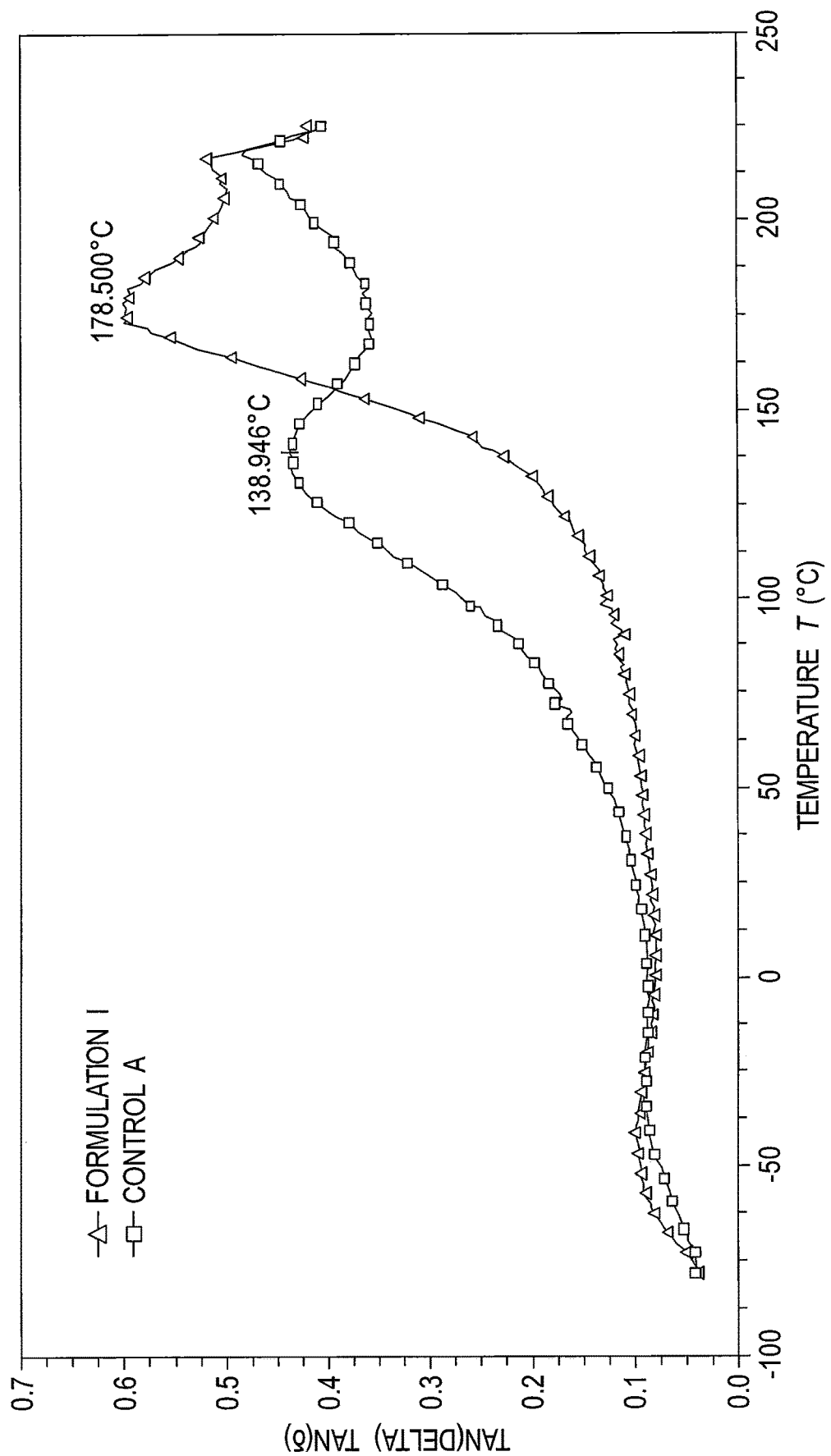
FIG. 1: Dynamic Mechanical Analysis (DMA) curve of Formulation I compared to a non-MEKO containing formulation (Control A). Control A formulation is described in Table 2 below. DMA: RSA-G2, Temperature ramp 5° C./min, 10 Hz.

The present invention is now described more fully hereinafter with reference to the accompanying examples, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art, as well as specific examples thereof.

As used herein, the term "and/or" includes any and all possible combinations or one or more of the associated listed items, as well as the lack of combinations when interpreted in the alternative ("or").

"ABPU" as used herein refers to UV-curable, (meth) acrylate blocked, polyurethane/polyurea (i.e., reactive blocked polyurethane) such as described in U.S. Pat. Nos. 9,453,142 and 9,598,606 to Rolland et al. ABPUs are reactive blocked polyurethanes. A particular example of a suitable reactive (or UV-curable) blocking group is a tertiary amine-containing (meth)acrylate (e.g., t-butylaminoethyl methacrylate, t-BAEMA). Note, however, that t-BAEMA has a glass transition temperature of about room temperature, which is less preferred for the production of rigid or elastomeric objects, as discussed further below.

"VBPU" as used herein refers to a volatile blocking group blocked, polyurethane/polyurea.

Volatile blocking agents that may be used to carry out the present invention include, for example, ketoximes, amides, imides, imidazoles, pyrazoles, alcohols, and sterically-hindered amines, such as 2-butanone oxime (also called methyl ethyl ketoxime or "MEKO"), acetone oxime, cyclopentanone oxime, cyclohexanone oxime, ε-caprolactam, N-methylacetamide, imidazole, succinimide, benzotriazole, N-hydroxyphthalimide, 1,2,4-triazole, 2-ethyl-1-hexanol, phenol, 3,5-dimethylpyrazole, 2,2,6,6-tetramethylpiperidine, and diisopropylamine (see, e.g., Scheme 2).

Scheme 2. Examples of volatile blocking agents.

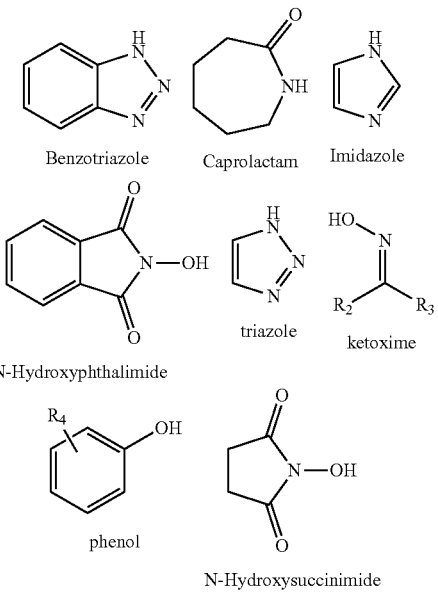

"Volatile blocking group" as used herein refers to a substituent produced by the covalent coupling of a volatile blocking agent as described above to the reactive group (particularly an isocyanate group) of a reactive compound (such as a diisocyanate monomer or prepolymer).

Polyisocyanates (including diisocyanates) useful in carrying out the present invention include, but are not limited to, 1,1'-methylenebis(4-isocyanatobenzene) (MDI), 2,4-diisocyanato-1-methylbenzene (TDI), methylene-bis(4-cyclohexylisocyanate) ($H_{12}$MDI), hexamethylene diisocyanate (HDI), isophorone diisocyanate (IPDI), polymeric MDI, 1,4-phenylene diisocyanate (PPDI), and o-tolidine diisocyanate (TODI). The preferred diisocyanate is $H_{12}$MDI, such as Desmodur W, supplied by Covestro AG. Additional examples include but are not limited to those given in U.S. Pat. No. 3,694,389 to Levy.

Catalysts useful in carrying out the present invention to prepare VBPUs from prepolymers and volatile blocking groups include, but are not limited to, dibutyltin dilaurate, stannous octoate, and bismuth octoate. A preferred catalyst is the bismuth catalyst K-KAT 348, supplied by King Industries, Inc.

Polyols, polyamines, and polythiols useful in carrying out the present invention (e.g., for preparation of prepolymers as a resin constituent) are known. Examples include, but are not limited to, poly(ethylene glycol), poly(propylene glycol), poly(trimethylene glycol), poly(tetramethylene glycol) (PTMO), hydroxy-terminated poly(dimethylsiloxane), polyester diol especially polycaprolactone (PCL) diol, PTMO-PCL copolymer diol (Capa 7201A from Perstorp), hydroxy-terminated polybutadiene, and polyetheramines (for example JEFFAMINE® from Huntsman Corporation). A preferred polyol, polyamine, and polythiol is PTMO, with an average $M_n$ between 500 to 3000 Da.

Curatives useful for carrying out the present invention (e.g., for reacting with prepolymers after formation of an intermediate object) are known. Examples include, but are not limited to polyols such as diols (such as ethylene glycol, 1,3-propane diol, 1,4-butanediol, 1,6-hexanediol, hydroquinone bis(2-hydroxyethyl) ether, 1,4-cyclohexanedimethanol), aliphatic, aromatic, and mixed aliphatic and aromatic, polyamines, such as diamines (for example, 4,4'-methylenedicyclohexanamine (PACM), 4,4'-methylenebis(2-methylcyclohexyl-amine) (MACM), ethylene diamine, isophorone diamine, diethyltoluenediamine), and polyetheramines (for example JEFFAMINE® from Huntsman Corporation).

Photoinitiators useful in the present invention include, but are not limited to, diphenyl(2,4,6-trimethylbenzoyl)phosphine oxide (TPO), Phenylbis(2,4,6-trimethylbenzoyl)phosphine oxide (PPO), 2-isopropylthioxanthone and/or 4-isopropylthioxanthone (ITX), etc.

"Diluents" as used herein includes both UV-curable diluents (for example monoacrylates, mono-methacrylates, polyacrylates, polymethacrylates, acrylamides, methacrylamides, etc.), and non-UV-curable diluents (for example, plasticizers such as bis(2-ethylhexyl) phthalate, bis(2-propylheptyl) phthalate, diisononyl phthalate, tri-(2-ethylhexyl) trimellitate, bis(2-ethylhexyl) adipate, diisononyl adipate, dibutyl sebacate, diisobutyl maleate, etc.).

"Solvents" as used herein includes, for example, diethyl ether, tetrahydrofuran, ethyl acetate, benzene, toluene, N,N-dimethylformamide, propylene carbonate, dimethyl carbonate, etc.

"Soft segment" and "hard segment" as used herein have their usual meaning in the polymer chemistry field. "Soft segment" refers to a typically high molecular weight chain that has a glass transition temperature less than room temperature, is generally amorphous or partially crystalline, and provides flexibility to the copolymer, and generally has a large number of degrees of freedom. "Hard segment" as used herein refers to a higher glass transition temperature, generally crystalline, rigid, generally oligomeric molecular weight segment that can provide mechanical integrity or strength to the segmented copolymer.

1. Production of VBPUs

VBPUs can be prepared in accordance with known procedures (see, e.g., U.S. Pat. No. 3,694,389 to Levy) or variations thereof that will be apparent to those skilled in the art based on the disclosure below.

A first example synthesis of a VBPU is given in Scheme 3 below, where $R_2$ represents an organic group (e.g., an optionally substituted aliphatic, aromatic, or mixed aliphatic and aromatic, group), the wavy line represents a polymer of an organic group (as found in a prepolymer), H-$B_2$ represents a volatile blocking agent, $B_2$ represents a volatile blocking group, and x is as given below.

Scheme 3. First example synthesis of a VBPU

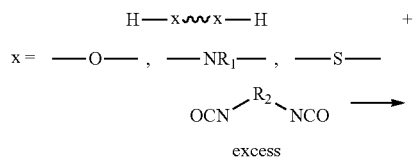

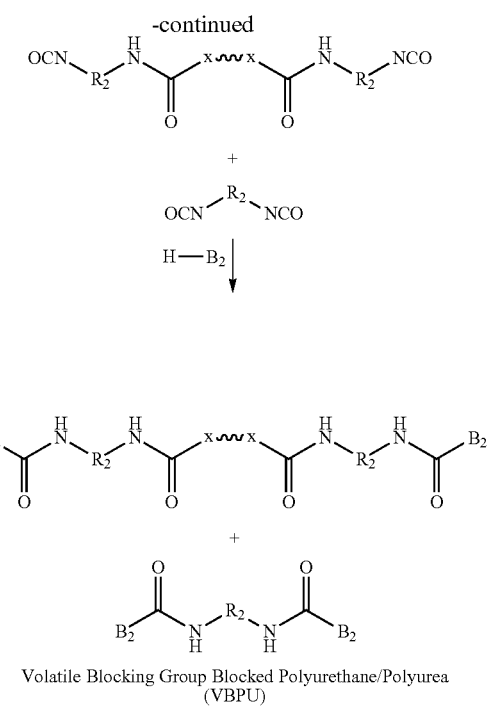

Volatile Blocking Group Blocked Polyurethane/Polyurea (VBPU)

In some embodiments, the benefit of incorporating such groups is that it provides multiple methods of tuning final mechanical properties by controlling the polyurethane/polyurea and UV-network percentages, allowing the ability to control the resulting glass transition temperature ($T_g$) and mechanical properties. As shown in Scheme 3, the volatile blocking group blocked polyurethane/polyurea (VBPU) prepolymer can be added to a UV-curable formulation, such as one containing an acrylate-blocked polyurethane (ABPU) as described in J. Rolland et al., U.S. Pat. Nos. 9,453,142 and 9,598,606.

In the alternative, the VBPU can be synthesized separately or in conjunction with a UV-reactive prepolymer, as shown in Scheme 4.

Scheme 4. Second example synthesis of a VBPU.

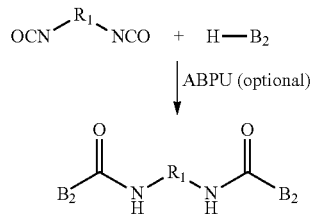

In Scheme 4, $R_1$ represents an optionally substituted aliphatic, aromatic, or mixed aliphatic and aromatic, group, H-$B_2$ represents a volatile blocking agent, and $B_2$ represents a volatile blocking group.

As shown in Scheme 5, once a green intermediate object is produced from a dual cure resin containing a VBPU, the VBPU in the object is then reacted with a curative (H-y-$R_2$-y-H in Scheme 5) to produce higher molecular weight polyurethane/polyurea in the final object, to aid in producing the desired mechanical properties in that object.

Scheme 5. Example deblocking reaction of a VBPU, where H—B$_2$ is volatilized.

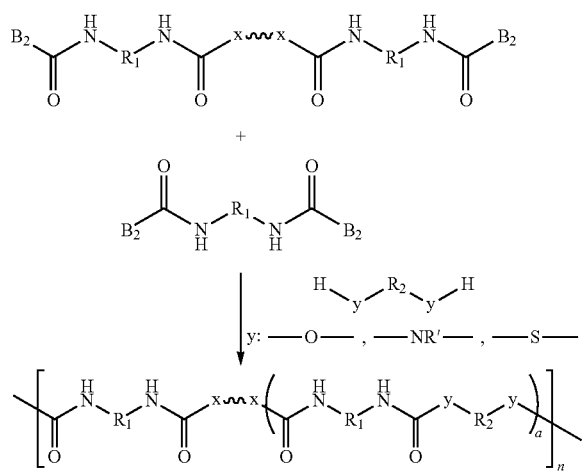

In Scheme 5 above, each x is as given in Scheme 3, each y is as given therein, each $R_1$ and $R_2$ represents an independently selected, optionally substituted, aliphatic, aromatic, or mixed aliphatic and aromatic, group, $B_2$ represents a volatile blocking group; and the wavy line represents the polymeric repeat segment of a polyurethane or polyurea prepolymer.

Scheme 6 shows a more specific example of general Scheme 3 above, and includes initially reacting a diisocyanate molecule, in the presence of catalyst, with a polyol, polyamine, or polythiol, or combination thereof. The remaining isocyanate (NCO) is then reacted with the volatile blocking group 2-butanone oxime (methyl ethyl ketoxime, or "MEKO").

Scheme 6. Exemplary synthesis of a MEKO-blocked VBPU.

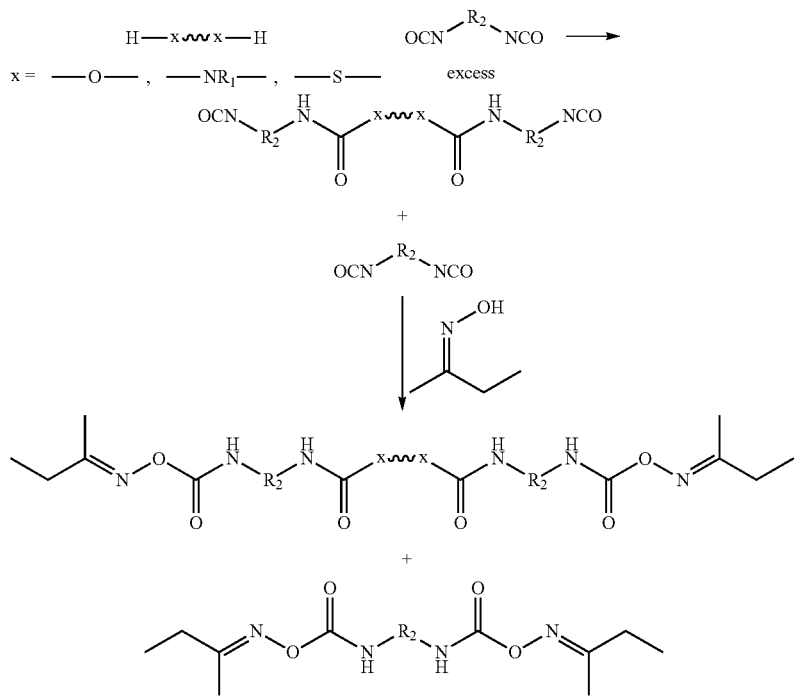

In Scheme 6, $R_2$ and the wavy line are as given in connection with Scheme 3 above, and the equivalent ratio of diisocyanate to polyol/polyamine/polythiol can be from 6:1 to 1.5:1 and preferably from 2.4:1 to 2:1.

Schemes 7-8 below show a more specific example of general Scheme 4 above, including reacting a diisocyanate molecule directly with the volatile blocking group at a molar ratio of 1:2. This can also be synthesized in the presence of other components, such as UV-curable diluents, non-UV-curable diluents (such as plasticizer), solvents, and/or ABPUs.

Scheme 7. Generalized scheme of blocked polyurethane/polyurea containing both UV-curable group and volatile blocking group (H—B$_2$).

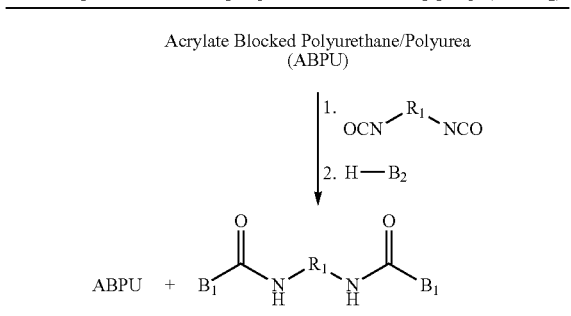

Scheme 8. Synthesis of volatile blocked isocyanate, with MEKO as the example.

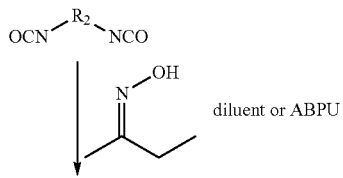

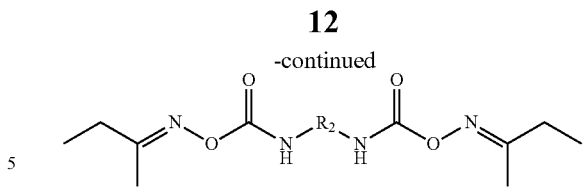

In another alternative, the VBPU can include the volatile blocking group and the UV-curable group on the same prepolymer, as shown in Scheme 9, where H-B$_1$ is a UV-curable blocking group and H-B$_2$ is a volatile blocking group.

Scheme 9. A VBPU structure containing both a UV-curable blocking group (H—B$_1$) and volatile blocking group (H—B$_2$) on the sample prepolymer.

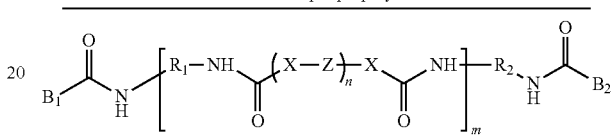

More specifically, an exemplary synthesis to such a structure along with an ABPU is shown in Scheme 10, where the UV-curable blocking group is t-BAEMA and the volatile blocking group is 3,5-dimethylpyrazole (DMP), along with H$_{12}$MDI diisocyanate and PTMO.

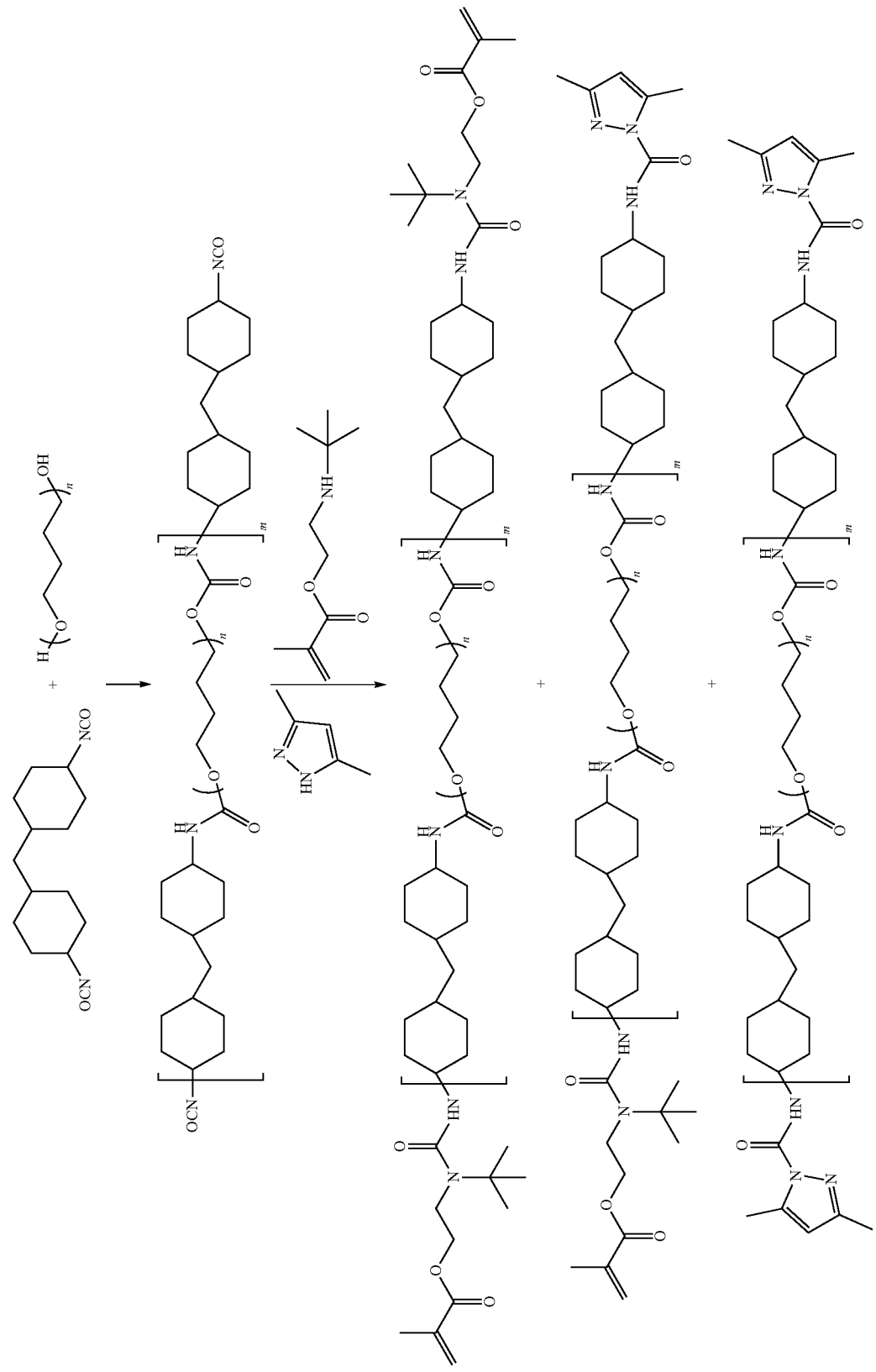
Scheme 10. Synthesis of t-BAEMA and DMP-blocked isocyanate, using H₁₂MDI diisocyanate and PTMO.

2. Dual Cure Resins Containing VBPUs.

VBPUs as described above (or other "Part B" reactive constituents as described below, blocked with a volatile reactive group as described above) can be incorporated into any of a variety of different dual cure resins for additive manufacturing, including but not limited to those described in U.S. Pat. Nos. 9,453,142 and 9,598,606 to Rolland et al.

In general, such resins can comprise: (a) light-polymerizable monomers and/or prepolymers that can form an intermediate object (typically in the presence of a photocatalyst); and (b) heat (or microwave, RF energy)-polymerizable (or otherwise further polymerizable) monomers and/or prepolymers. As noted above, in the present invention these constituents may be supplemented with an organic diluent as described above, and discussed further below.

A. Light-polymerizable monomers and/or prepolymers. Sometimes also referred to as "Part A" of the resin, these are monomers and/or prepolymers that can be polymerized by exposure to actinic radiation or light. This resin can have a functionality of 2 or higher. A purpose of Part A is to "lock" the shape of the object being formed or create a scaffold for the one or more additional components (e.g., Part B). Importantly, Part A is present at or above the minimum quantity needed to maintain the shape of the object being formed after the initial solidification during photolithography. In some embodiments, this amount corresponds to less than ten, twenty, or thirty percent by weight of the total resin (polymerizable liquid) composition.

Examples of suitable reactive end groups suitable for Part A constituents, monomers, or prepolymers include, but are not limited to: acrylates, methacrylates, α-olefins, N-vinyls, acrylamides, methacrylamides, styrenics, epoxies, thiols, 1,3-dienes, vinyl halides, acrylonitriles, vinyl esters, maleimides, and vinyl ethers.

An aspect of the solidification of Part A is that it provides a scaffold in which a second reactive resin component, termed "Part B," can solidify during a second step, as discussed further below.

Note that, in some embodiments, a light polymerizable component (a "Part A" component), once polymerized, may degrade during further curing (e.g., during heating or baking) to form a constituent for the further (e.g., heat) cure. Thus, it is converted, in part, to a "Part B" component, though other portions (e.g., remaining light-reactive blocking groups such as t-BAEMA), may not participate in the further cure, and hence make little or no contribution to the mechanical properties of the final product. Indeed, such remaining fragments of the light-polymerized scaffold may be deleterious to those final properties, particularly when hard and soft segment content are to be tuned to obtain a high or low $T_g$ product. For applications such as these, inclusion of VBPUs as described herein, along with ABPUs, can be particularly advantageous.

B. Heat-polymerizable monomers and/or prepolymers. Sometimes also referred to as "Part B", these constituents may comprise, consist of or consist essentially of a mix of monomers and/or prepolymers that possess reactive end groups that participate in a second solidification reaction after the Part A solidification reaction. In general, for dual cure resins, examples of methods used to solidify Part B include, but are not limited to, contacting the object or scaffold to heat, water or water vapor, light at a different wavelength than that at which Part A is cured, catalysts, (with or without additional heat), evaporation of a solvent from the polymerizable liquid (e.g., using heat, vacuum, or a combination thereof), microwave irradiation, etc., including combinations thereof. In this case, heat curing of the "Part B" resins is preferred.

Examples of suitable reactive end group pairs suitable for Part B constituents, monomers or prepolymers include, but are not limited to: epoxy/amine, epoxy/hydroxyl, oxetane/amine, oxetane/alcohol, isocyanate*/hydroxyl, isocyanate*/amine, isocyanate/carboxylic acid, anhydride/amine, amine/carboxylic acid, amine/ester, hydroxyl/carboxylic acid, hydroxyl/acid chloride, amine/acid chloride, vinyl/Si—H (hydrosilylation), Si—Cl/hydroxyl, Si—Cl/amine, hydroxyl/aldehyde, amine/aldehyde, hydroxymethyl or alkoxymethyl amide/alcohol, aminoplast, alkyne/azide (also known as one embodiment of "Click Chemistry," along with additional reactions including thiolene, Michael additions, Diels-Alder reactions, nucleophilic substitution reactions, etc.), alkene/Sulfur (polybutadiene vulcanization), alkene/peroxide, alkene/thiol, alkyne/thiol, hydroxyl/halide, isocyanate*/water (polyurethane foams), Si—OH/hydroxyl, Si—OH/water, Si—OH/Si—H (tin catalyzed silicone), Si—OH/Si—OH (tin catalyzed silicone), perfluorovinyl (coupling to form perfluorocyclobutane), etc., where *isocyanates include protected isocyanates (e.g. oximes)), diene/dienophiles for Diels-Alder reactions, olefin metathesis polymerization, olefin polymerization using Ziegler-Natta catalysis, ring-opening polymerization (including ring-opening olefin metathesis polymerization, lactams, lactones, siloxanes, epoxides, cyclic ethers, imines, cyclic acetals, etc.), etc. As will be noted from the above, the "Part B" components generally comprise at least a pair of compounds, reactive with one another (e.g., a polyisocyanate, and a polyamine).

C. Additional resin ingredients. Photoinitiators included in the polymerizable liquid (resin) can be any suitable photoinitiator, including type I and type II photoinitiators and including commonly used UV photoinitiators, examples of which include but are not limited to such as acetophenones (diethoxyacetophenone for example), phosphine oxides such as diphenyl(2,4,6-trimethylbenzoyl)phosphine oxide, phenylbis(2,4,6-trimethylbenzoyl) phosphine oxide (PPO), Irgacure 369, etc. See, e.g., U.S. Pat. No. 9,453,142 to Rolland et al.

The liquid resin or polymerizable material can have solid particles suspended or dispersed therein. Any suitable solid particle can be used, depending upon the end product being fabricated. The particles can be metallic, organic/polymeric, inorganic, or composites or mixtures thereof. The particles can be nonconductive, semi-conductive, or conductive (including metallic and non-metallic or polymer conductors); and the particles can be magnetic, ferromagnetic, paramagnetic, or nonmagnetic. The particles can be of any suitable shape, including spherical, elliptical, cylindrical, etc. The particles can be of any suitable size (for example, ranging from 1 nm to 20 µm average diameter).

The particles can comprise an active agent or detectable compound as described below, though these may also be provided dissolved or solubilized in the liquid resin as also discussed below. For example, magnetic or paramagnetic particles or nanoparticles can be employed.

The liquid resin can have additional ingredients solubilized therein, including pigments, dyes, diluents, active compounds or pharmaceutical compounds, detectable compounds (e.g., fluorescent, phosphorescent, radioactive), etc., again depending upon the particular purpose of the product being fabricated. Examples of such additional ingredients include, but are not limited to, proteins, peptides, nucleic acids (DNA, RNA) such as siRNA, sugars, small organic compounds (drugs and drug-like compounds), etc., including combinations thereof.

Dyes/non-reactive light absorbers. In some embodiments, polymerizable liquids for carrying out the present invention include a non-reactive pigment or dye that absorbs light, particularly UV light. Suitable examples of such light absorbers include, but are not limited to: (i) titanium dioxide (e.g., included in an amount of from 0.05 or 0.1 to 1 or 5 percent by weight), (ii) carbon black (e.g., included in an amount of from 0.05 or 0.1 to 1 or 5 percent by weight), and/or (iii) an organic ultraviolet light absorber such as a hydroxybenzophenone, hydroxyphenylbenzotriazole, oxanilide, benzophenone, thioxanthone, hydroxypenyltriazine, and/or benzotriazole ultraviolet light absorber (e.g., Mayzo BLS1326) (e.g., included in an amount of 0.001 or 0.005 to 1, 2 or 4 percent by weight). Examples of suitable organic ultraviolet light absorbers include, but are not limited to, those described in U.S. Pat. Nos. 3,213,058; 6,916,867; 7,157,586; and 7,695,643, the disclosures of which are incorporated herein by reference.

Fillers. Any suitable filler may be used in connection with the present invention, depending on the properties desired in the part or object to be made. Thus, fillers may be solid or liquid, organic or inorganic, and may include reactive and non-reactive rubbers: siloxanes, acrylonitrile-butadiene rubbers; reactive and non-reactive thermoplastics (including but not limited to: poly(ether imides), maleimide-styrene terpolymers, polyarylates, polysulfones and polyethersulfones, etc.) inorganic fillers such as silicates (such as talc, clays, silica, mica), glass, carbon nanotubes, graphene, cellulose nanocrystals, etc., including combinations of all of the foregoing. Suitable fillers include tougheners, such as core-shell rubbers, as discussed below.

Tougheners. One or more polymeric and/or inorganic tougheners can be used as a filler in the present invention. See generally US Patent Application Publication No. 20150215430. The toughener may be uniformly distributed in the form of particles in the cured product. The particles could be less than 5 microns (μm) in diameter. Such tougheners include, but are not limited to, those formed from elastomers, branched polymers, hyperbranched polymers, dendrimers, rubbery polymers, rubbery copolymers, block copolymers, core-shell particles, oxides or inorganic materials such as clay, polyhedral oligomeric silsesquioxanes (POSS), carbonaceous materials (e.g., carbon black, carbon nanotubes, carbon nanofibers, fullerenes), ceramics and silicon carbides, with or without surface modification or functionalization.

Core-shell rubbers. Core-shell rubbers are particulate materials (particles) having a rubbery core. Such materials are known and described in, for example, US Patent Application Publication No. 20150184039, as well as US Patent Application Publication No. 20150240113, and U.S. Pat. Nos. 6,861,475, 7,625,977, 7,642,316, 8,088,245, and elsewhere. In some embodiments, the core-shell rubber particles are nanoparticles (i.e., having an average particle size of less than 1000 nanometers (nm)). Generally, the average particle size of the core-shell rubber nanoparticles is less than 500 nm, e.g., less than 300 nm, less than 200 nm, less than 100 nm, or even less than 50 nm. Typically, such particles are spherical, so the particle size is the diameter; however, if the particles are not spherical, the particle size is defined as the longest dimension of the particle. Suitable core-shell rubbers include, but are not limited to, those sold by Kaneka Corporation under the designation Kaneka Kane Ace, including the Kaneka Kane Ace 15 and 120 series of products, including Kaneka Kane Ace MX 120, Kaneka Kane Ace MX 153, Kaneka Kane Ace MX 154, Kaneka Kane Ace MX 156, Kaneka Kane Ace MX170, Kaneka Kane Ace MX 257 and Kaneka Kane Ace MX 120 core-shell rubber dispersions, and mixtures thereof.

Organic diluents. In some embodiments, diluents for use in the present invention are preferably reactive organic diluents; that is, diluents that will degrade, isomerize, cross-react, or polymerize, with themselves or a light polymerizable component, during the additive manufacturing step. In general, the diluent(s) are included in an amount sufficient to reduce the viscosity of the polymerizable liquid or resin (e.g., to not more than 15,000, 10,000, 6,000, 5,000, 4,000, or 3,000 centipoise at 25 degrees Centigrade). Suitable examples of diluents include, but are not limited to, N,N-dimethylacrylamide, N-vinyl-2-pyrrolidone, and N-vinyl formamide, or a mixture if two or more thereof. The diluent may be included in the polymerizable liquid in any suitable amount, typically from 1, 5 or 10 percent by weight, up to about 30 or 40 percent by weight, or more.

3. Compounds having a Reactive Blocking Group and a Volatile Blocking Group.

Prepolymer compounds that may be useful in the resins (polymerizable liquids) described herein include those of formula I:

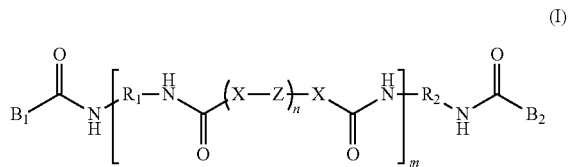

wherein:

$B_1$ is a reactive blocking group (e.g., comprising acrylates, methacrylates, α-olefins, N-vinyls, acrylamides, methacrylamides, styrenics, epoxides, thiols, 1,3-dienes, vinyl halides, acrylonitriles, vinyl esters, maleimides, vinyl ethers, and ethylenically unsaturated end groups);

$B_2$ is a volatile blocking group (e.g., comprising ketoximes, amides, imides, imidazoles, oximes, pyrazoles, alcohols, phenols, sterically-hindered amines, lactams, succinimides, triazoles, and phthalimides, optionally substituted (e.g., substituted 1, 2, 3 or 4 or more times with a suitable group, such as a straight chain or branched $C_1$-$C_{10}$alkyl group));

$R_1$ and $R_2$ are independently selected from the group comprising an aliphatic, aromatic or mixed aliphatic and aromatic group, optionally substituted (e.g., substituted 1, 2, 3 or 4 or more times with a suitable group, such as a straight chain or branched $C_1$-$C_{10}$alkyl group)

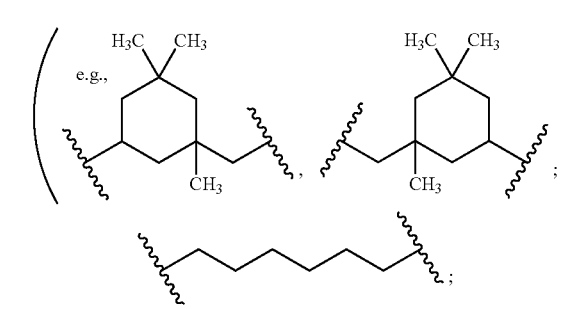

-continued

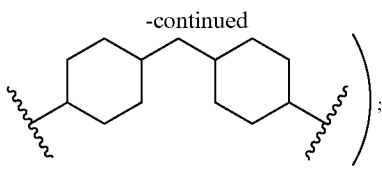

X is O, S, or NR$_3$, wherein R$_3$ is H or a straight chain or branched C$_1$-C$_{10}$ alkyl group;

Z is a polymeric organic group (e.g., (CH$_2$)$_3$);

n is an integer in the range of from 1, 5, 10, 20 or 30 to 80, 100, or 150 (for example, PO3G with a MW of 2400 g/mol would have n=41 and PO3G with MW of 3000 g/mol would have n=51. Poly(propylene glycol) 4000 g/mol would have n=103); and m is an integer in the range of from 1, 5, 10 or 20 to 50, 70 or 100.

Monomer compounds that may be useful in the resins described herein include those of formula II:

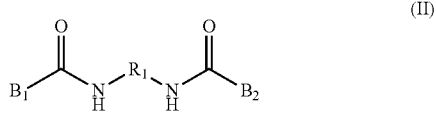

(II)

wherein:

B$_1$ is a reactive blocking group (e.g., comprising acrylates, methacrylates, α-olefins, N-vinyls, acrylamides, methacrylamides, styrenics, epoxides, thiols, 1,3-dienes, vinyl halides, acrylonitriles, vinyl esters, maleimides, vinyl ethers, and ethylenically unsaturated end groups);

B$_2$ is a volatile blocking group (e.g., comprising ketoximes, amides, imides, imidazoles, oximes, pyrazoles, alcohols, phenols, sterically-hindered amines, lactams, succinimides, triazoles, and phthalimides, optionally substituted (e.g., substituted 1, 2, 3 or 4 or more times with a suitable group, such as a straight chain or branched C$_1$-C$_{10}$alkyl group)); and R$_1$ is an aliphatic, aromatic or mixed aliphatic and aromatic group (e.g., a straight chain or branched C$_1$-C$_{15}$alkyl or aromatic group), optionally substituted (e.g., substituted 1, 2, 3 or 4 or more times with a suitable group, such as a straight chain or branched C$_1$-C$_{10}$alkyl group).

As a non-limiting example, such prepolymer and/or monomer compounds may be provided as a mixture along with compounds having termini with reactive blocking groups and/or compounds having termini with volatile blocking groups (see Scheme 10 above).

In some embodiments, prepolymer and/or monomer compounds may be provided as a resin composition, which composition may include a curative, and/or other resin components as further described above.

4. Methods of Use in Additive Manufacturing.

Polymerizable liquids or resins as described herein are used to make three-dimensional objects in a first "light" cure (typically by additive manufacturing) which generates a "green" intermediate object, followed by a second heat cure of that intermediate object.

Techniques for additive manufacturing are known. Suitable techniques include bottom-up or top-down additive manufacturing, generally known as stereolithography. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, U.S. Patent Application Publication No. 2013/0292862 to Joyce, and US Patent Application Publication No. 2013/0295212 to Chen et al. The disclosures of these patents and applications are incorporated by reference herein in their entirety.

In some embodiments, the intermediate object is formed by continuous liquid interface production (CLIP). CLIP is known and described in, for example, PCT Application Nos. PCT/US2014/015486 (published as U.S. Pat. No. 9,211,678 on Dec. 15, 2015); PCT/US2014/015506 (also published as U.S. Pat. No. 9,205,601 on Dec. 8, 2015), PCT/US2014/015497 (also published as U.S. Pat. No. 9,216,546 on Dec. 22, 2015), and in J. Tumbleston, D. Shirvanyants, N. Ermoshkin et al., Continuous liquid interface production of 3D Objects, *Science* 347, 1349-1352 (published online 16 Mar. 2015). See also R. Janusziewcz et al., Layerless fabrication with continuous liquid interface production, *Proc. Natl. Acad. Sci. USA* 113, 11703-11708 (Oct. 18, 2016). In some embodiments, CLIP employs features of a bottom-up three-dimensional fabrication as described above, but the irradiating and/or said advancing steps are carried out while also concurrently maintaining a stable or persistent liquid interface between the growing object and the build surface or window, such as by: (i) continuously maintaining a dead zone of polymerizable liquid in contact with said build surface, and (ii) continuously maintaining a gradient of polymerization zone (such as an active surface) between the dead zone and the solid polymer and in contact with each thereof, the gradient of polymerization zone comprising the first component in partially cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone. Other approaches for carrying out CLIP that can be used in the present invention and potentially obviate the need for a semipermeable "window" or window structure include utilizing a liquid interface comprising an immiscible liquid (see L. Robeson et al., WO 2015/164234, published Oct. 29, 2015), generating oxygen as an inhibitor by electrolysis (see I Craven et al., WO 2016/133759, published Aug. 25, 2016), and incorporating magnetically positionable particles to which the photoactivator is coupled into the polymerizable liquid (see J. Rolland, WO 2016/145182, published Sep. 15, 2016).

After the intermediate three-dimensional object is formed, it is optionally washed, optionally dried (e.g., air dried) and/or rinsed (in any sequence). It is then further cured, preferably by heating (although further curing may in some embodiments be concurrent with the first cure, or may be by different mechanisms such as contacting to water, as described in U.S. Pat. No. 9,453,142 to Rolland et al.).

Heating may be active heating (e.g., in an oven, such as an electric, gas, solar oven or microwave oven, or combination thereof), or passive heating (e.g., at ambient (room) temperature). Active heating will generally be more rapid than passive heating and in some embodiments is preferred, but passive heating—such as simply maintaining the intermediate at ambient temperature for a sufficient time to effect further cure—is in some embodiments preferred.

In some embodiments, the heating step is carried out at least a first (oven) temperature and a second (oven) temperature, with the first temperature greater than ambient temperature, the second temperature greater than the first temperature, and the second temperature less than 300° C. (e.g., with ramped or step-wise increases between ambient temperature and the first temperature, and/or between the first temperature and the second temperature). In some embodiments, the heating step is carried out at least a first (oven) temperature and a second (oven) temperature, with the first temperature greater than ambient temperature, the second temperature greater than the first temperature, and the second temperature less than 300° C. (e.g., with ramped or step-wise increases between ambient temperature and the first temperature, and/or between the first temperature and the second temperature).

For example, the intermediate may be heated in a stepwise manner at a first temperature of about 70° C. to about 150° C., and then at a second temperature of about 150° C. to 200 or 250° C., with the duration of each heating depending on the size, shape, and/or thickness of the intermediate. In another embodiment, the intermediate may be cured by a ramped heating schedule, with the temperature ramped from ambient temperature through a temperature of 70 to 150° C., and up to a final (oven) temperature of 250 or 300° C., at a change in heating rate of 0.5° C. per minute, to 5° C. per minute. (See, e.g., U.S. Pat. No. 4,785,075).

The present invention is explained in greater detail in the following examples. Abbreviations used below are given in the detailed description above. SR252 and SR313B were received from Sartomer (Arkema Group). K-KAT 348 and K-KAT XK-651 were received from King Industries, Inc.

Example 1

Synthesis of Volatile NCO-Blocking Group [VBPU1]

In a reactor was added Desmodur W (263.18 g) and K-KAT 348 (0.447 g). The mixture was heated to 70° C. and PTMO with an average Mn~2,000 (854.70 g) was added dropwise over 3 hours. After one additional hour of stirring, the temperature was decreased to 50° C. MEKO (100.52 g) was added dropwise over 3 hours while maintaining the temperature at 50° C. and stirred for an additional 12 hours. The reaction was complete when NCO content was <0.1%. VBPU1 was colorless, transparent, and had a viscosity of 304,000 cP at 25.0° C.

Example 2

Synthesis of Volatile NCO-Blocking Group with UV-Reactive NCO-Blocking Group [VBPU2]

In a reactor containing an ABPU (1128.81 g, comprised of $H_{12}MDI:PTMO$ (Mn~2,000 Da):t-BAEMA with a molar ratio of 2.2-1.0-2.4) at 50° C. was added Desmodur W (44.03 g). After stirring for 3 hours, MEKO (29.28 g) was added dropwise over 1 hour and stirred at 50° C. for 18 hours. The reaction was complete when NCO content was <0.1%. VBPU2 was colorless, transparent, and had a viscosity of 420,000 cP at 25.0° C.

Examples 3-5

Overview of Resin Formulation and Production Procedures

In brief overview, the photoinitiator (for example, TPO) was dissolved in a diluent from a selected group of UV-curable or non-UV active compounds. To this solution was added the remaining components ABPU, VBPU, and additives (such as particle fillers, dyes, pigment, UV-stabilizers, UV absorbers, and non-reactive oligomers) excluding the curative. The curative is added and mixed prior to the production of three-dimensional sample objects by additive manufacturing step, preferably by stereolithography and particularly by continuous liquid interface production (CLIP). UV-curing profiles were measured to obtain the additive production parameters. Printed parts were wiped or washed with an organic solvent and post-cured by heating or by microwave. The heating temperature can be from 60° C. to 250° C. and preferably from 80° C. to 140° C. The heating time can be from minutes to days, and preferably from 1 to 12 hours. The formulations may be described as the hard segment weight percent (HS %) and polyurethane/polyurea weight percent (PU %). The calculation for the HS % and PU % is shown below:

$$PU \text{ Weight } \% = \frac{\text{Soft Segment} + \text{Diisocyanate} + \text{Curative}}{ABPU + VBPU + \text{Curative} + \text{Diluent}} \times 100$$

$$HS \text{ Weight } \% = \frac{\text{Diisocyanate} + \text{Rigid Curative}}{\text{Soft Segment} + \text{Diisocyanate} + \text{Curative}} \times 100$$

Therefore, in rigid systems, it is desirable to formulate systems with high glass transition temperature ($T_g$) monomers such as isobornyl methacrylate (IBOMA). In contrast, elastomeric material may choose to select low-$T_g$ diluents such as lauryl methacrylate (LMA) or plasticizers such as diisononyl adipate (DINA).

Example 3

Formulation I with VBPU1

The following procedure describes the formulation process using VBPU1 in a formulation. The HS includes the diisocyanate ($H_{12}MDI$) components of the VBPU and ABPUs and the curative (MACM). The formulation recipe is shown below:

TABLE 1

| Formulation I | |
| --- | --- |
| Component | Amount (g) |
| VBPU1 | 15.11 |
| ABPU1* | 38.61 |
| ABPU2* | 30.78 |
| IBOMA | 48.63 |
| 4,4'-Methylenebis(2-methylcyclohexylamine) (MACM) | 10.01 |
| hydroxyphenylbenzotriazoles | 0.41 |
| TPO | 1.44 |

*synthesized as shown in Scheme 1, and analogously to the VBPU 1 shown in Example 1, where ABPU1 is comprised of t-BAEMA:$H_{12}$MDI:PTMO (Mn ~2,000 Da) with a molar ratio of 2.7:2.35:1.0 and ABPU2 is comprised of t-BAEMA:$H_{12}$MDI:PTMO (Mn ~1,000 Da) with a molar ratio of 2.4:2.2:1.0.

TABLE 2

| Formulation of Control A | |
| --- | --- |
| Component | Amount (g) |
| ABPU1 | 38.61 |
| ABPU2 | 21.55 |
| IBOMA | 31.51 |

TABLE 2-continued

Formulation of Control A

| Component | Amount (g) |
|---|---|
| 4,4'-Methylenebis(2-methylcyclohexylamine) (MACM) | 7.04 |
| hydroxyphenylbenzotriazoles | 0.21 |
| TPO | 0.99 |

The photoinitiator TPO (1.44 g) was dissolved in IBOMA (48.63 g). The remaining ABPU1 (38.61 g), ABPU2 (30.78 g), VBPU1 (15.11 g), and hydroxyphenylbenzotriazole (0.41 g) were added to the TPO-IBOMA mixture. Afterwards, MACM (10.01 g) was added to the formulation and mixed. The UV curing profile of the resin was measured. Sample three dimensional objects were produced on a Carbon M1 apparatus, cleaned and baked at 120° C. for 12 h. Results are given in FIG. 1 and in Table 3.

TABLE 3

Tensile Properties of Formulation I compared to Control A.

| ASTM D 638-10 | Control A | Formulation I |
|---|---|---|
| Thickness | 4 mm | 4 mm |
| Young's Modulus (MPa) | 325 | 330 |
| % Elongation | 364 | 398 |
| Yield Strain | 11.5 | 13.2 |
| Tensile Strength (MPa) | 34.6 | 32.1 |

Example 4

Formulation with VBPU1

The ratio of the MEKO:H$_{12}$MDI:PTMO (Mn~2,000 Da) and t-BAEMA:H$_{12}$MDI:PTMO (Mn~2,000 Da) can be added at any varying ratios. Table 4 describes the recipe for a formulation containing the 37% HS and 57% PU illustrating this example:

TABLE 4

Formulation II

| Component | Amount (g) |
|---|---|
| VBPU1 | 16.79 |
| ABPU1 | 19.31 |
| ABPU2 | 21.03 |
| IBOMA | 34.74 |
| MACM | 6.87 |
| hydroxyphenylbenzotriazoles | 0.21 |
| TPO | 0.99 |

Figure 2:
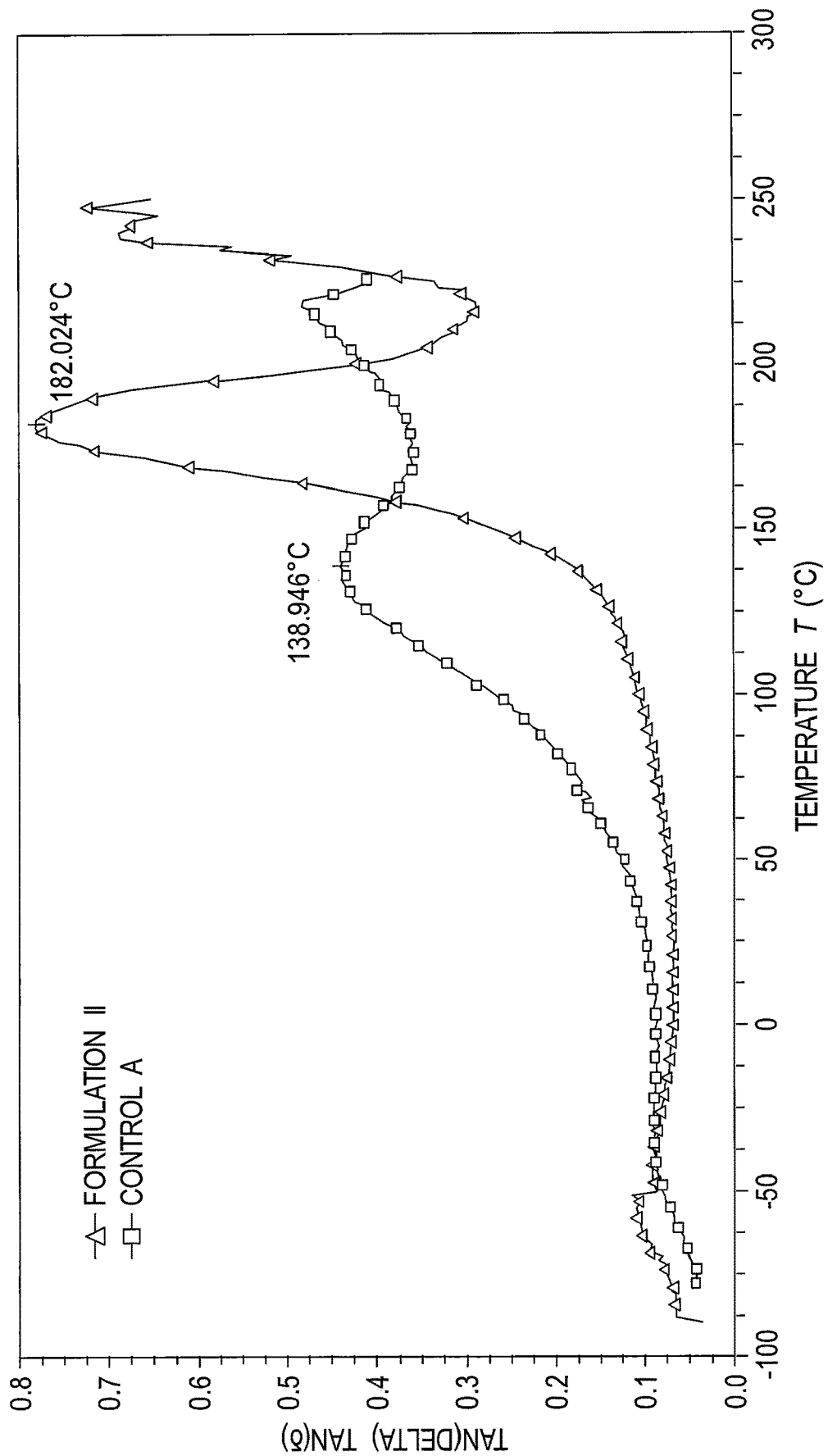
FIG. 2: DMA curve of Formulation II compared to a non-MEKO containing formulation (Control A). DMA: RSA-G2, Temperature ramp 5° C./min, 10 Hz.

The photoinitiator TPO (0.99 g) was dissolved in IBOMA (34.74 g). The remaining ABPU1 (19.31 g), ABPU2 (21.03 g), VBPU1 (16.79 g), and hydroxyphenylbenzotriazole (0.21 g) were added to the TPO-IBOMA mixture. Afterwards, MACM (6.87 g) was added to the formulation and mixed. The UV curing profile of the resin was measured. Sample three-dimensional objects were produced on a Carbon M1 apparatus, cleaned and baked at 120° C. for 12 h. Results are given in FIG. 2 and Table 5.

TABLE 5

Tensile Properties of Formulation II compared to control.

| ASTM D 638-10 | Control A | Formulation II |
|---|---|---|
| Thickness | 4 mm | 4 mm |
| Young's Modulus (MPa) | 325 | 364 |
| % Elongation | 364 | 388 |
| Yield Strain | 11.5 | 10.5 |
| Tensile Strength (MPa) | 34.6 | 33.6 |

Example 5

Formulation with VBPU2

Table 6 describes the formulation for example 5 containing VBPU2. The formulation contains 37% HS and 57% PU.

TABLE 6

Formulation III

| Component | Amount (g) |
|---|---|
| VBPU2 | 48.19 |
| ABPU2 | 9.59 |
| IBOMA | 33.68 |
| TPO | 0.99 |
| hydroxyphenylbenzotriazoles | 0.21 |
| MACM | 7.25 |

Figure 3:
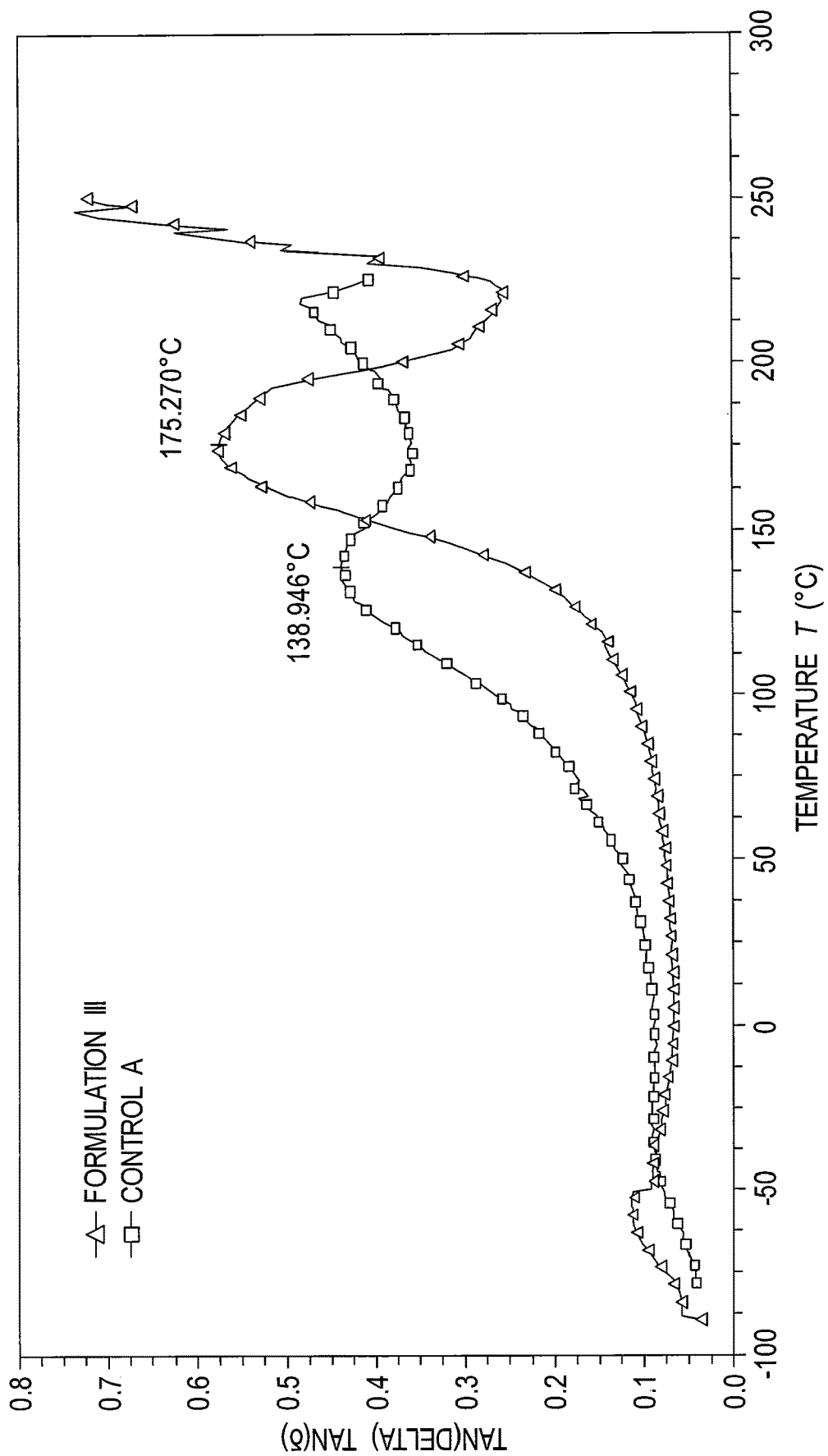
FIG. 3: DMA data of Formulation III, prepared in like manner to that described in connection with FIGS. 1-2 above.

The photoinitiator TPO (0.99 g) was dissolved in IBOMA (33.68 g). The remaining ABPU2 (9.59 g), VBPU2 (48.19 g), and hydroxyphenylbenzotriazole (0.21 g) were added to the TPO-IBOMA mixture. Afterwards, MACM (7.25 g) was added to the formulation and mixed. The UV curing profile of the resin was measured. Sample three-dimensional objects were produced on a Carbon, Inc. M1 apparatus, wiped clean, and then baked at 120° C. for 12 h. Results are given in FIG. 3 and Table 7.

TABLE 7

Tensile properties of Formulation III

| ASTM D 638-10 | Control A | Formulation III |
|---|---|---|
| Thickness | 4 mm | 4 mm |
| Young's Modulus (MPa) | 325 | 344.3 |
| % Elongation | 364 | 402 |
| Yield Strain | 11.5 | 12.7 |
| UTS | 34.6 | 31.9 |

Example 6

Out-Gassing of Volatile Blocking Agents

Sample three-dimensional objects produced as described above were examined for evidence of surface defects such as blisters, bubbles, pores, pits or "fish eyes," caused by out-gassing of the volatile blocking agent regenerated during either the initial additive manufacturing step (as the light polymerization reaction is generally exothermic) or during the subsequent heat cure step. No substantial defect formation was observed.

Example 7

Synthesis of Acrylate and Volatile NCO-Blocking Group [VBPU3]

In a reactor was added Desmodur W (580.50 g), SR313B (145.70 g), and K-KAT XK-651 (0.83 g). The mixture was heated to 70° C. and PTMO with an average Mn 2,000 (1489.50 g) was added dropwise over 2 hours. After 5 additional minutes of stirring, 3,5-dimethylpyrazole (133.24 g) was added in one portion. After stirring for 1 hour, the mixture temperature was decreased to 50° C. and 4-methoxyphenol (0.988 g) was added. t-BAEMA (288.04 g) was added over 2 hours and stirred for 16 hours. SR252 (654.19 g) was then added and the mixture was stirred for 90 minutes. The reaction was complete when NCO content was <0.1%. VBPU3 was colorless and transparent when collected with a viscosity of 20,600 cP at 25.0° C.

Example 8

Formulation with VBPU3

Table 8 describes the formulation for Example 8 containing VBPU3. The formulation contains 38.5% HS and 69% PU.

TABLE 8

Formulation IV

| Component | Amount (g) |
|---|---|
| VBPU3 | 90.38 |
| TPO | 0.66 |
| Wikoff White | 0.56 |
| MACM | 9.63 |

The photoinitiator TPO (0.66 g) and wikoff white pigment (0.56 g) was dissolved in VBPU3 (90.38 g). Afterwards, MACM (9.63 g) was added to the formulation and mixed. The UV curing profile of the resin was measured. Sample three-dimensional objects were produced on a Carbon, Inc. M1 apparatus, wiped clean, and then baked at 120° C. for 12 h. Results are given in Table 9.

TABLE 9

Tensile properties of Formulation IV

| ASTM D 638-10 | Formulation IV |
|---|---|
| Young's Modulus (MPa) | 28.6 |
| % Elongation | 6.9 |
| Stress @ 50% Strain | 223 |

The foregoing is illustrative of the present invention, and is not to be construed as limiting thereof. The invention is defined by the following claims, with equivalents of the claims to be included therein.

We claim:

1. A method of forming a three-dimensional object, comprising:
    (a) providing a carrier and an optically transparent member having a build surface, said carrier and said build surface defining a build region therebetween;
    (b) filling said build region with a polymerizable liquid, said polymerizable liquid comprising a mixture of (i) a light polymerizable first component, and (ii) a heat polymerizable second component;
    said heat polymerizable second component comprising (i) a first blocked reactive constituent that is blocked with a volatile blocking group, and optionally (ii) a curative;
    (c) irradiating said build region with light through said optically transparent member to form a solid polymer scaffold from said first component and also advancing said carrier and said build surface away from one another to form a three-dimensional intermediate having the same shape as, or a shape to be imparted to, said three-dimensional object, with said three-dimensional intermediate containing said first blocked reactive constituent in unpolymerized form; and then
    (d) heating said three-dimensional intermediate sufficiently to (i) cleave said volatile blocking group from said reactive constituent and (ii) polymerize said blocked reactive constituent with itself, and/or said curative, and with (iii) said volatile blocking group vaporizing out of said three-dimensional intermediate, to form said three-dimensional object,
    wherein said light polymerizable first component comprises a second blocked reactive constituent that is blocked with a light reactive blocking group; and
    said heating step (d) is carried out under conditions in which at least a portion of said solid polymer scaffold produced by light polymerization of said second blocked reactive constituent degrades and forms a constituent that participates in heat polymerizing to form said three-dimensional object, and
    wherein said second blocked reactive constituent comprises a blocked polyisocyanate having two or more ethylenically unsaturated end groups.

2. The method of claim 1, wherein said volatile blocking group comprises a ketoxime, amide, imide, imidazole, pyrazole, alcohol, or sterically-hindered amine blocking group.

3. The method of claim 1, wherein said first blocked reactive constituent comprises a blocked polyisocyanate.

4. The method of claim 1, wherein said first blocked reactive constituent comprises a ketoxime-blocked polyisocyanate.

5. The method of claim 1, wherein said curative is present and comprises a polyol, a polyamine, a polyetheramine, or a combination thereof.

6. The method of claim 1, wherein said three-dimensional object comprises a polymer blend, interpenetrating polymer network, semi-interpenetrating polymer network, or sequential interpenetrating polymer network formed from said first component and said second component.

7. The method of claim 1, wherein: said second component comprises precursors to a polyurethane, polyurea, or copolymer thereof; a silicone resin, an epoxy resin, a cyanate ester resin, or a natural rubber.

8. The method of claim 1, wherein said first blocked reactive constituent is included in said polymerizable liquid in an amount of from 1 percent by weight, to 50 percent by weight, or more.

9. The method of claim 1, said polymerizable liquid further comprising at least one photoinitiator, optionally at least one dye, and optionally at least one filler.

10. The method of claim 1, wherein said second blocked reactive constituent is included in said polymerizable liquid in an amount of from 1 percent by weight, to 50 percent by weight, or more.

11. The method of claim 1, wherein said first blocked reactive constituent and said second blocked reactive constituent are included together in said polymerizable liquid in a weight ratio of from 1:5 to 20:1.

12. The method of claim 1, wherein said irradiating and/or said advancing steps are carried out while also concurrently: (i) continuously maintaining a dead zone of polymerizable liquid in contact with said build surface, and (ii) continuously maintaining a gradient of polymerization zone between said dead zone and said solid polymer and in contact with each thereof, said gradient of polymerization zone comprising said first component in partially cured form.

13. The method of claim 12, wherein said optically transparent member comprises a semipermeable member, and said continuously maintaining a dead zone is carried out by feeding an inhibitor of polymerization through said optically transparent member, thereby creating a gradient of inhibitor in said dead zone and optionally in at least a portion of said gradient of polymerization zone.

14. The method of claim 13, wherein said optically transparent member comprises a fluoropolymer.

15. The method of claim 13, wherein: said first component comprises a free radical polymerizable liquid and said inhibitor comprises oxygen; or said first component comprises an acid-catalyzed or cationically polymerizable liquid, and said inhibitor comprises a base.

16. The method of claim 1, wherein said volatile blocking group is formed from covalent coupling of a volatile blocking agent selected from the group consisting of: 2-butanone oxime, acetone oxime, cyclopentanone oxime, cyclohexanone oxime, ε-caprolactam, N-methylacetamide, imidazole, succinimide, benzotriazole, N-hydroxyphthalimide, 1,2,4-triazole, 2-ethyl-1-hexanol, phenol, 3,5-dimethylpyrazole, 2,2,6,6-tetramethylpiperidine, and diisopropylamine.

17. The method of claim 1, wherein said volatile blocking group is formed from covalent coupling of a ketoxime, pyrazole, or alcohol volatile blocking agent.

18. The method of claim 1, wherein said volatile blocking group is formed from covalent coupling of 2-butanone oxime or 3,5-dimethylpyrazole.

19. A method of forming a three-dimensional object, comprising:
(a) providing a carrier and an optically transparent member having a build surface, said carrier and said build surface defining a build region therebetween;
(b) filling said build region with a polymerizable liquid, said polymerizable liquid comprising a mixture of (i) a light polymerizable first component, and (ii) a heat polymerizable second component;
said heat polymerizable second component comprising (i) a first blocked reactive constituent that is blocked with a volatile blocking group, and optionally (ii) a curative;
(c) irradiating said build region with light through said optically transparent member to form a solid polymer scaffold from said first component and also advancing said carrier and said build surface away from one another to form a three-dimensional intermediate having the same shape as, or a shape to be imparted to, said three-dimensional object, with said three-dimensional intermediate containing said first blocked reactive constituent in unpolymerized form; and then
(d) heating said three-dimensional intermediate sufficiently to (i) cleave said volatile blocking group from said reactive constituent and (ii) polymerize said blocked reactive constituent with itself, and/or said curative, and with (iii) said volatile blocking group vaporizing out of said three-dimensional intermediate, to form said three-dimensional object, wherein said light polymerizable first component comprises a second blocked reactive constituent that is blocked with a light reactive blocking group; and
said heating step (d) is carried out under conditions in which at least a portion of said solid polymer scaffold produced by light polymerization of said second blocked reactive constituent degrades and forms a constituent that participates in heat polymerizing to form said three-dimensional object, and
wherein:
(i) said object is elastomeric and is comprised of a polymer having a glass transition temperature of not more than 0° C.; or
(ii) said object is rigid and is comprised of a polymer having a glass transition temperature of at least 50° C.

20. The method of claim 19, wherein said volatile blocking group comprises a ketoxime, amide, imide, imidazole, pyrazole, alcohol, or sterically-hindered amine blocking group.

21. The method of claim 19, wherein said first blocked reactive constituent comprises a blocked polyisocyanate.

22. The method of claim 19, wherein said first blocked reactive constituent comprises a ketoxime-blocked polyisocyanate.

23. The method of claim 19, wherein said curative is present and comprises a polyol, a polyamine, a polyetheramine, or a combination thereof.

24. The method of claim 19, wherein said three-dimensional object comprises a polymer blend, interpenetrating polymer network, semi-interpenetrating polymer network, or sequential interpenetrating polymer network formed from said first component and said second component.

25. The method of claim 19, wherein: said second component comprises precursors to a polyurethane, polyurea, or copolymer thereof; a silicone resin, an epoxy resin, a cyanate ester resin, or a natural rubber.

26. The method of claim 19, wherein said first blocked reactive constituent is included in said polymerizable liquid in an amount of from 1 percent by weight, to 50 percent by weight, or more.

27. The method of claim 19, said polymerizable liquid further comprising at least one photoinitiator, optionally at least one dye, and optionally at least one filler.

28. The method of claim 19, wherein said second blocked reactive constituent is included in said polymerizable liquid in an amount of from 1 percent by weight, to 50 percent by weight, or more.

29. The method of claim 19, wherein said first blocked reactive constituent and said second blocked reactive constituent are included together in said polymerizable liquid in a weight ratio of from 1:5 to 20:1.

30. The method of claim 19, wherein said volatile blocking group is formed from covalent coupling of a volatile blocking agent selected from the group consisting of: 2-butanone oxime, acetone oxime, cyclopentanone oxime, cyclohexanone oxime, ε-caprolactam, N-methylacetamide, imidazole, succinimide, benzotriazole, N-hydroxyphthalimide, 1,2,4-triazole, 2-ethyl-1-hexanol, phenol, 3,5-dimethylpyrazole, 2,2,6,6-tetramethylpiperidine, and diisopropylamine.

31. The method of claim 19, wherein said volatile blocking group is formed from covalent coupling of a ketoxime, pyrazole, or alcohol volatile blocking agent.

32. The method of claim 19, wherein said volatile blocking group is formed from covalent coupling of 2-butanone oxime or 3,5-dimethylpyrazole.

33. The method of claim 19, wherein said irradiating and/or said advancing steps are carried out while also concurrently: (i) continuously maintaining a dead zone of polymerizable liquid in contact with said build surface, and (ii) continuously maintaining a gradient of polymerization zone between said dead zone and said solid polymer and in contact with each thereof, said gradient of polymerization zone comprising said first component in partially cured form.

34. The method of claim 33, wherein said optically transparent member comprises a semipermeable member, and said continuously maintaining a dead zone is carried out by feeding an inhibitor of polymerization through said optically transparent member, thereby creating a gradient of inhibitor in said dead zone and optionally in at least a portion of said gradient of polymerization zone.

35. The method of claim 34, wherein said optically transparent member comprises a fluoropolymer.

36. The method of claim 34, wherein: said first component comprises a free radical polymerizable liquid and said inhibitor comprises oxygen; or said first component comprises an acid-catalyzed or cationically polymerizable liquid, and said inhibitor comprises a base.

* * * * *

UNITED STATES PATENT AND TRADEMARK OFFICE
CERTIFICATE OF CORRECTION

PATENT NO. : 11,226,559 B2
APPLICATION NO. : 16/615446
DATED : January 18, 2022
INVENTOR(S) : Chen et al.

Page 1 of 1

It is certified that error appears in the above-identified patent and that said Letters Patent is hereby corrected as shown below:

In the Specification

Column 11, Lines 5-15: Please delete Scheme 7 and replace with the following:

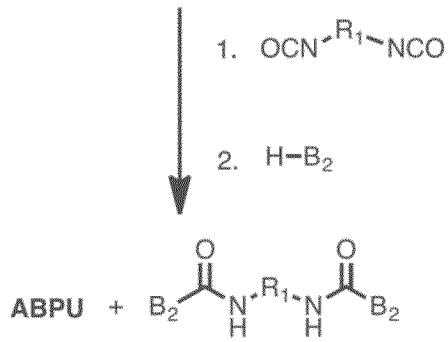

Signed and Sealed this
Seventeenth Day of May, 2022

Katherine Kelly Vidal
*Director of the United States Patent and Trademark Office*